(12) United States Patent
Irizarry et al.

(10) Patent No.: US 9,343,119 B2
(45) Date of Patent: May 17, 2016

(54) BUS CIRCUITS FOR MEMORY DEVICES

(71) Applicant: Intel Corporation, Santa Clara, CA (US)

(72) Inventors: Nicolas L. Irizarry, Folsom, CA (US); Balaji Srinivasan, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/479,020

(22) Filed: Sep. 5, 2014

(65) Prior Publication Data

US 2016/0071553 A1    Mar. 10, 2016

(51) Int. Cl.
| | |
|---|---|
| *G11C 7/22* | (2006.01) |
| *G11C 5/14* | (2006.01) |
| *G11C 13/00* | (2006.01) |
| *G11C 16/30* | (2006.01) |

(52) U.S. Cl.
CPC ............ *G11C 5/147* (2013.01); *G11C 13/0038* (2013.01); *G11C 16/30* (2013.01)

(58) Field of Classification Search
CPC ..................................... G11C 7/22; G11C 7/06
USPC .................... 365/189.011, 189.18, 189.19
See application file for complete search history.

(56) References Cited

U.S. PATENT DOCUMENTS

| | | | |
|---|---|---|---|
| 6,434,049 B1 | 8/2002 | Trivedi et al. | |
| 2010/0254209 A1* | 10/2010 | Lee | G11C 5/063 365/226 |
| 2013/0299674 A1* | 11/2013 | Fowler | H04N 5/37455 250/208.1 |

* cited by examiner

*Primary Examiner* — Huan Hoang
(74) *Attorney, Agent, or Firm* — Schwabe, Williamson & Wyatt, P.C.

(57) ABSTRACT

Embodiments of bus circuits and related techniques are disclosed herein. In some embodiments, a bus circuit may include: a source follower arrangement, including a first transistor and a second transistor, coupled between a supply voltage and an access line of a memory cell, wherein the first transistor and the second transistor each have a gate terminal and wherein the access line is a bit line or a word line; a capacitor having a first terminal coupled to the gate terminal of the first transistor and having a second terminal coupled to a reference voltage; and a switch coupled between the first terminal of the capacitor and a voltage regulator. Other embodiments may be disclosed and/or claimed.

21 Claims, 10 Drawing Sheets

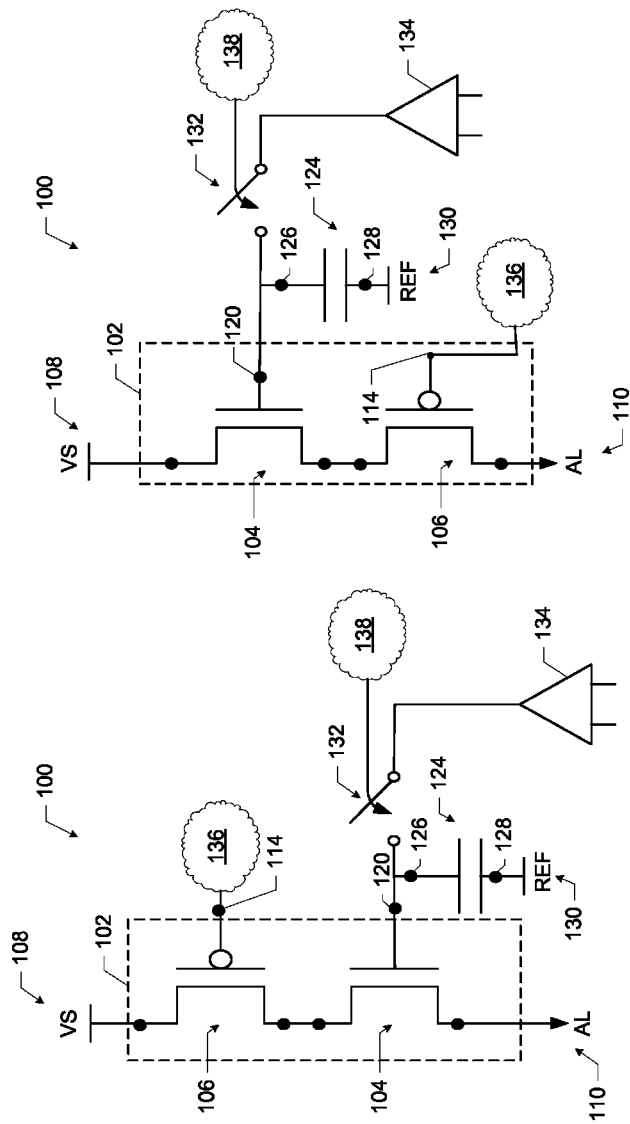

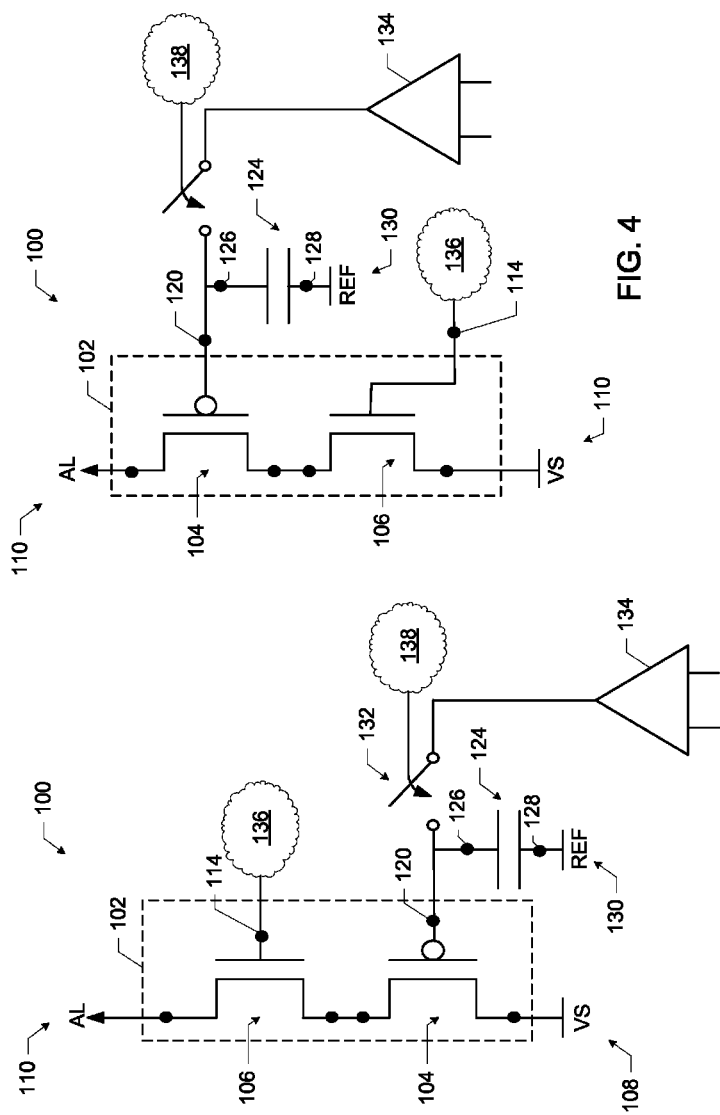

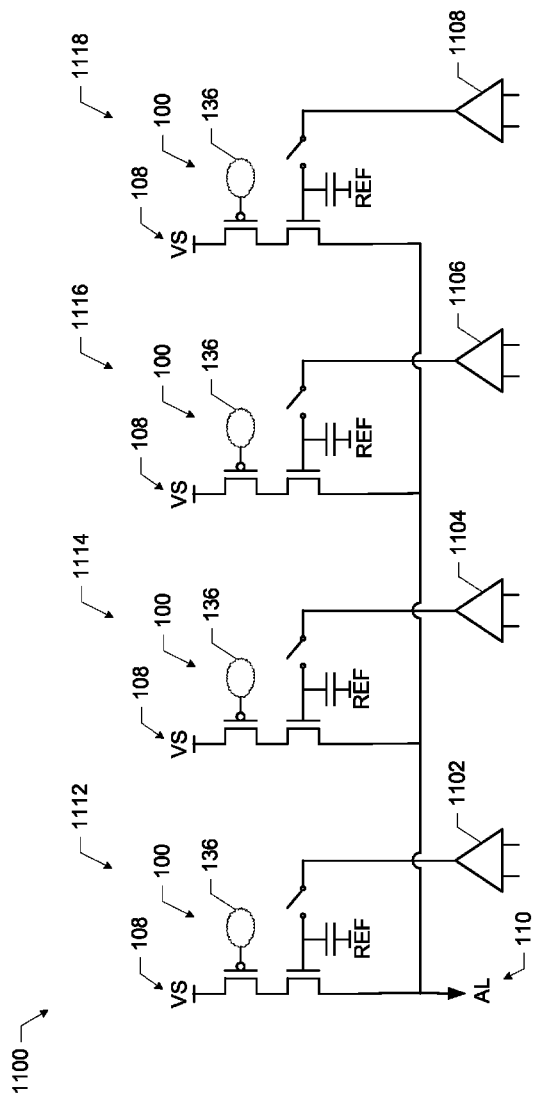

BUS CIRCUITS FOR MEMORY DEVICES

TECHNICAL FIELD

The present disclosure relates generally to the field of bus circuits, and more particularly, to bus circuits for memory devices.

BACKGROUND

Conventional memory device support circuits include high-power voltage regulators to maintain the voltages at various points in the circuit so that a read or write operation can be consistently and successfully performed. These voltage regulators expend significant energy during operation, typically have large footprints, and require low resistance routing that itself occupies expensive real estate on the surface of an integrated circuit chip.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 1-4 are schematics of bus circuits, in accordance with various embodiments.

FIG. 11 is a schematic of a bus circuit including multiple regulated voltages, in accordance with various embodiments.

DETAILED DESCRIPTION

Figure 5:
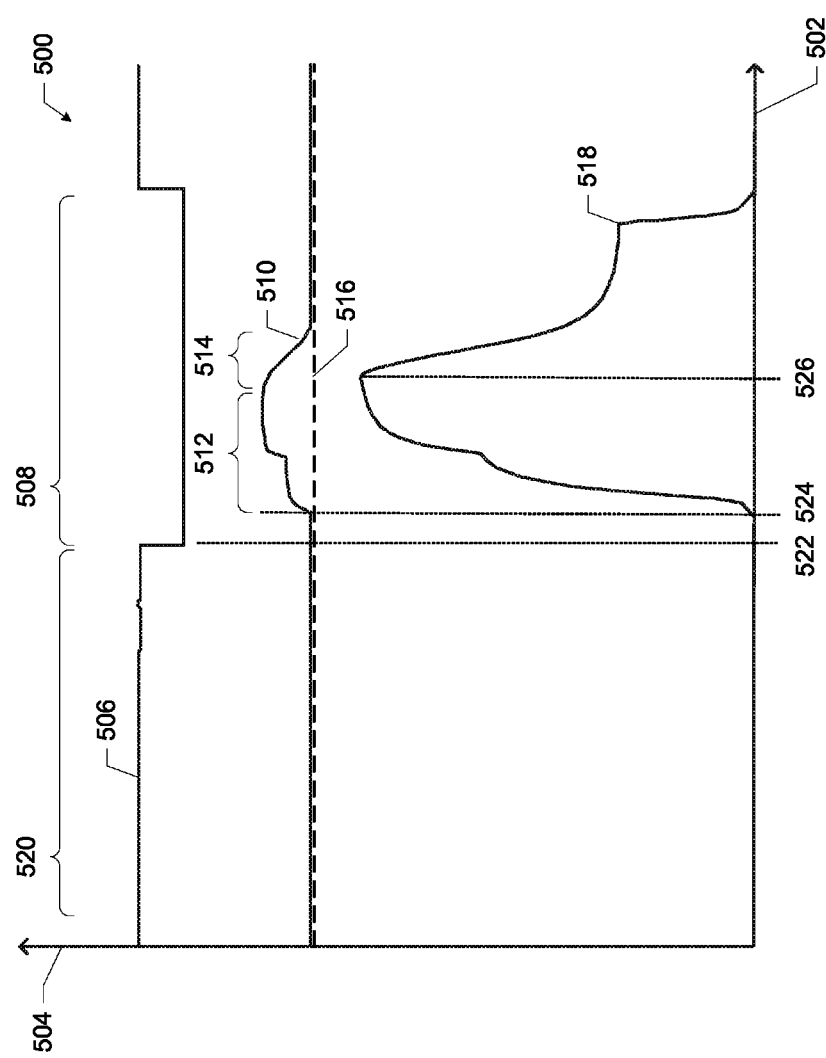
FIG. 5 is a plot illustrating operational characteristics of the bus circuits of FIGS. 1 and 2, in accordance with various embodiments.

Embodiments of bus circuits and related techniques are disclosed herein. In some embodiments, a bus circuit may include: a source follower arrangement, including a first transistor and a second transistor, coupled between a supply voltage and an access line of a memory cell, wherein the first transistor and the second transistor each have a gate terminal and wherein the access line of a memory cell is a bit line or a word line; a capacitor having a first terminal coupled to the gate terminal of the first transistor and having a second terminal coupled to a reference voltage; and a switch coupled between the first terminal of the capacitor and a voltage regulator.

Various ones of the bus circuits and related techniques disclosed herein may enable high accuracy, low footprint, and low-power voltage regulation in a noisy environment. As noted above, some conventional support circuits for memory devices included a high-power regulator to drive a low resistance global bus. In such approaches, the high-power regulator was configured to remove coupling noise injected onto the bus during operation. This coupling noise may be local in origin or may arise from coupling between different partitions (groupings of memory cells) in a memory chip. Consequently, the coupling between partitions affected the accuracy of the regulation in those partitions.

The ability of a conventional high-power regulator to remove the noise in conventional support circuits determined the accuracy with which voltages were locally provided to memory cells, and this accuracy affects the ability to read and write to the memory cell. In particular, consistent and successful operation of a memory device may require that the variation on the access lines supplied to different memory cells in a chip may vary no more than a predetermined amount (e.g., 100 millivolts). Higher accuracy in voltage regulation required faster and stronger voltage regulators, and faster and stronger voltage regulators consume more power and occupy more area in integrated circuit devices. The requirement of a low resistance bus meant that wide metal pathways needed to be provided, incurring additional footprint overhead. These requirements make it difficult (if not impossible) to implement conventional support circuits for memory devices in smaller packages and/or with low power requirements.

Various ones of the embodiments disclosed herein reject the conventional approach of using high-power regulators and low resistance buses in favor of an alternative approach that allows the size and power of memory device support circuits to be reduced while achieving the desired accuracy in access line voltages. In particular, instead of using a high-power global voltage regulator to counteract the coupling that occurs during operation of the memory device, various voltages in the bus circuits disclosed herein may be allowed to "float" and the coupling may be allowed to occur in a controlled manner using loading capacitors. Such embodiments observe and utilize a phenomenon previously unrecognized or otherwise thought to be undesirable: when a given partition in the memory device is active, the global bus may be coupled up (or down) by a certain amount, and when the partition returns to the idle state, the bus may be coupled down (or up) by the same amount. In particular, the coupling that occurs when the partition is active and the coupling that occurs when the partition is idle may "cancel" each other, and the bus may return to the same voltage it had prior to entering active mode.

Various ones of the bus circuits disclosed herein may include a low-power regulator to drive a bus to a predetermined voltage. This predetermined voltage may be equal to the voltage desired for the bus for successful completion of a read or write operation minus the amount of expected positive coupling when the associated memory cell becomes active (or plus the amount of expected negative coupling when the associated memory cell becomes active). For example, if the desired voltage on the bus during a read or write operation is 3 volts, and the bus is expected to experience 300 millivolts of positive coupling, the low-power voltage regulator may provide a voltage of 2.7 volts to the bus. The bus will reach 3 volts after the positive coupling occurs when active mode is entered, and will return to 2.7 volts in response to the "negative coupling" as the access line returns to its idle state.

By floating the bus and allowing it to return to the same "baseline" idle voltage after activation, the voltage regulator need not expend any energy to remove the coupling. Instead, as described above, the coupling may be anticipated and provided for. Consequently, there may be no need for a high-power voltage regulator to remove the positive/negative coupling. Instead, the "floating" techniques disclosed herein may "self-correct" the bus voltage.

Various embodiments disclosed herein may achieve a greater accuracy than conventional approaches. In particular, conventional approaches have located the high-power voltage regulator far away from the location at which the coupling occurs. In such approaches, the ability of the high-power voltage regulator to remove coupling disturbances was limited by both the drive strength of the voltage regulator (a function of the amount of power consumed by the voltage regulator) and the resistance-capacitance (RC) time constant of the regulated bus (a function of the width of the metal routing). Achieving high accuracy, therefore, required high-power voltage regulators operating on a low resistance (wide) bus. In various ones of the embodiments disclosed herein, there is no requirement to move charge long distances quickly, and thus no need for wide buses or high-power regulators. Consequently, various ones of the embodiments disclosed herein may achieve a desired accuracy with smaller routing requirements (resulting in area savings) and lower power voltage regulators (resulting in power savings).

Various ones of the embodiments disclosed herein may be implemented in memory devices using any suitable architecture. For example, various embodiments may be implemented in three-dimensional cross point memory structures. Various embodiments may be implemented in phase change memory structures (e.g., phase change memory with switch (PCMS) structures) or FLASH memory structures (e.g., those typically used to store data, such as images or music, on a phone, Universal Serial Bus (USB) memory stick, etc.).

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description uses the phrases "in an embodiment," or "in embodiments," which may each refer to one or more of the same or different embodiments. Furthermore, the terms "comprising," "including," "having," and the like, as used with respect to embodiments of the present disclosure, are synonymous. As used herein, the phrase "coupled" may mean that two or more elements are in direct physical or electrical contact, or that two or more elements are not in direct contact with each other, but yet still cooperate or interact with each other (e.g., via one or more intermediate elements, which may perform their own transformations or have their own effects). For example, two elements may be coupled to each other when both elements communicate with a common element (e.g., a common circuit element). As used herein, the term "logic" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable components that provide the described functionality.

FIGS. 1-4 are schematics of bus circuits 100, in accordance with various embodiments. Each of the bus circuits 100 illustrated in FIGS. 1-4 may include a source follower arrangement 102. The source follower arrangement 102 may include a first transistor 104 and a second transistor 106, coupled between a supply voltage 108 (VS) and an access line 110 (AL) of a memory cell (not shown). The first transistor 104 may have a gate terminal 120 and the second transistor 106 may have a gate terminal 114. The bus circuit 100 may also include a capacitor 124. The capacitor 124 may have a first terminal 126 coupled to the gate terminal 120 of the first transistor 104 and a second terminal 128 coupled to a reference voltage 130 (REF). In some embodiments, the reference voltage 130 may be a ground. However, the reference voltage 130 need not be a ground, and may instead be any suitable positive or negative reference voltage. The bus circuit 100 may also include a switch 132 coupled between the first terminal 126 of the capacitor 124 and a voltage regulator 134.

The bus circuit 100 may be coupled to or include control logic 136 for the source follower arrangement 102. The control logic 136 may be coupled to the gate terminal 114 of the second transistor 106 and may cause selective charging of the access line 110 from the supply voltage 108 by applying various voltages to the gate terminal 114 to "open" and "close" the second transistor 106 (e.g., in response to control signals generated by the control logic 136 or by another circuit). In some embodiments, the control logic 136 may be configured to close (or "enable") the second transistor 106 when a read or write operation is to be performed on the memory cell coupled to the access line 110, and to open (or "disable") the second transistor 106 when no read or write operation is being performed on the memory cell. When the second transistor 106 is closed, the voltage at the access line 110 may charge toward the voltage provided by the supply voltage 108 until it reaches the voltage at the gate terminal 120 minus the threshold voltage of the first transistor 104. For example, if the gate terminal 120 operates at 3 volts and the threshold voltage of the first transistor 104 is 0.5 volts, the access line 110 may charge to 2.5 volts, and then stop charging. In some embodiments, "positive" regulation schemes may be used in which the voltage at the gate terminal 120 is positive and the voltage passed to the access line 110 from the supply voltage 108 is positive (e.g., as illustrated in and discussed below with reference to FIGS. 1 and 2). In other embodiments, "negative" regulation schemes may be used in which the voltage at the gate terminal 120 is negative and the voltage passed to the access line 110 from the supply voltage 108 is negative (e.g., as illustrated in and discussed below with reference to FIGS. 3 and 4). Charging the bit line and/or the word line of a memory cell during read or write operations is known in the art, and is thus not discussed in further detail herein.

The bus circuit 100 may be coupled to or include switch control logic 138 for the switch 132. The switch control logic 138 may cause selective opening and closing of the switch 132 (e.g., in response to control signals generated by the switch control logic 138 or by another circuit). The behavior of the control logic 136 and the switch control logic 138 may be coordinated. For example, when no read or write operation is being performed on the memory cell coupled to the access line 110 (and the control logic 136 has caused the second transistor 106 to open), the switch control logic 138 may be configured to close (or keep closed) the switch 132. During a read or write operation on the memory cell (when the control logic 136 has caused the second transistor 106 to close), the switch control logic 138 may be configured to open (or keep open) the switch 132.

When the switch 132 is closed, the voltage output by the voltage regulator 134 (referred to herein as the "regulated voltage") may be provided to the first terminal 126 of the capacitor 124, and thus the capacitor 124 may charge to this regulated voltage. The capacitor 124 may thus serve as a "loading" capacitor. If the control logic 136 simultaneously keeps the second transistor 106 "open," the voltage at the gate terminal 120 of the first transistor 104 may be approximately equal to the regulated voltage. When the second transistor 106 is closed, the supply voltage 108 may be allowed to charge the access line 110. Subsequently, if the switch 132 is opened while the second transistor 106 is closed, the voltage at the gate terminal 120 of the first transistor 104 may be the sum of two components: the regulated voltage to which the capacitor 124 was charged (prior to opening the switch 132) and a voltage induced on the gate terminal 120 by the coupling between the gate terminal 120 and the access line 110. This coupling may be triggered by the closing of the second transistor 106 by the control logic 136 and the charging of the access line 110. The capacitor 124 may be the dominant capacitance at the gate terminal 120, and may thus act to ensure that the coupling between the gate terminal 120 and various other points in the bus circuit 100 is not determined by parasitic capacitances, and is repeatable. The capacitance of the capacitor 124 may be selected based on the amount of parasitic capacitance experienced by the bus circuit 100, with larger parasitic capacitances suggesting larger capacitances of the capacitor 124.

During operation, the voltage regulator 134 may provide a regulated voltage to the gate terminal 120 of the first transistor 104 of the bus circuit 100. The switch 132 may then be opened, isolating the regulated voltage at the gate terminal 120 (due to the previous charging of the capacitor 124). The control logic 136 may then provide a voltage to the gate terminal 114 of the second transistor 106 to enable the selective charging of the access line 110 from the supply voltage 108. Because the switch 132 is open, the voltage at the gate terminal 120 of the first transistor 104 may be allowed to rise as the access line 110 is selectively charged (via coupling between the access line 110 and the gate terminal 120), without active regulation by the voltage regulator 134. This is in stark contrast to the operation of the conventional bus circuits, in which a high-power voltage regulator would expend significant energy to fight the coupling between the access line 110 and the gate terminal 120 in order to maintain the voltage at the gate terminal 120 at a fixed value. Additionally, having the switch 132 open may prevent or reduce undesired interaction between neighboring bus circuits 100 with different coupling activity.

After allowing the voltage at the gate terminal 120 of the first transistor 104 to couple up as the access line 110 is selectively charged, the voltage at the gate terminal 120 of the first transistor 104 may be allowed to couple back down to the regulated voltage as the access line 110 discharges. Again, this may occur without active regulation by the voltage regulator 134. Thus, the voltage regulator 134 may have little or no "work" to do to fight the coupling. Instead, the voltage regulator 134 may principally expend energy to charge the capacitor 124 during idle and incrementally recharge the capacitor 124 in response to any losses due to leakage. The voltage regulator 134 may thus be sampled and held, and may not need to drive its output while the memory cell is in active mode.

The following paragraphs discuss the various bus circuits 100 of FIGS. 1-4 in further detail. In FIG. 1, the first transistor 104 is an n-type metal-oxide-semiconductor (NMOS) transistor and the second transistor 106 is a p-type metal-oxide-semiconductor (PMOS) transistor. In FIG. 1, the second transistor 106 is coupled between the first transistor 104 and the supply voltage 108. The supply voltage 108 of FIG. 1 may be a positive supply voltage. In FIG. 1, the first transistor 104 is coupled between the second transistor 106 and the access line 110.

In FIG. 2, the first transistor 104 is an NMOS transistor and the second transistor 106 is a PMOS transistor. In FIG. 2, the second transistor 106 is coupled between the first transistor 104 and the access line 110. In FIG. 2, the first transistor 104 is coupled between the second transistor 106 and the supply voltage 108. The supply voltage 108 of FIG. 2 may be a positive supply voltage.

In FIG. 3, the first transistor 104 is a PMOS transistor and the second transistor 106 is an NMOS transistor. In FIG. 3, the second transistor 106 is coupled between the first transistor 104 and the access line 110. In FIG. 3, the first transistor 104 is coupled between the second transistor 106 and the supply voltage 108. The supply voltage 108 of FIG. 3 may be a negative supply voltage.

In FIG. 4, the first transistor 104 is a PMOS transistor and the second transistor 106 is an NMOS transistor. In FIG. 4, the second transistor 106 is coupled between the first transistor 104 and the supply voltage 108. The supply voltage 108 of FIG. 4 may be a negative supply voltage. In FIG. 4, the first transistor 104 is coupled between the second transistor 106 and the access line 110.

FIG. 5 is a plot 500 illustrating operational characteristics of the bus circuits 100 of FIGS. 1 and 2, in accordance with various embodiments. In particular, the plot 500 represents various voltage signals in the bus circuit 100 (along the voltage axis 504) as a function of time (along the time axis 502) when the access line 110 is a bit line. The voltage signal 510 represents the voltage at the gate terminal 120 of the first transistor 104, and the voltage signal 516 represents the regulated voltage output from the voltage regulator 134. The voltage signal 506 represents the control voltage provided to the switch 132 by the switch control logic 138. When the voltage signal 506 is "high," the switch 132 is closed, and when the voltage signal 506 is "low," the switch 132 is open. As shown in FIG. 5, a switch closed interval 520 transitions to a switch open interval 508 at a time 522. During the switch closed interval 520, the voltage signal 510 may be substantially identical to the voltage signal 516. The voltage signal 518 represents the voltage at the bit line 110.

At a time 524, the control logic 136 may cause the second transistor 106 to close, allowing the supply voltage 108 to charge the bit line 110 (as reflected in the voltage signal 518) to perform a read or write operation. The voltage at the gate terminal 120 may couple with the voltage at the bit line 110, causing the voltage at the gate terminal 120 (the voltage signal 510) to change as the voltage at the bit line 110 (the voltage signal 518) changes. In particular, as the bit line 110 charges "up," the voltage at the gate terminal 120 (the voltage signal 510) may couple "up" during the interval 512.

The read or write operations may take place at approximately the time 526. It is at this time that the voltage at the gate terminal 120 (represented by the voltage signal 510) should reach the desired level to ensure that the voltage at the bit line 110 (represented by the voltage signal 518) is at its desired value. Once the read or write operation has taken place, the bit line 110 may be allowed to discharge. As the bit line 110 discharges, the voltage at the gate terminal 120 (the voltage signal 510) may couple "down" during the interval 514. Because the voltage at the bit line 110 starts at and returns to the same "discharged" voltage, any coupling "up" that occurs at the gate terminal 120 during the charging of the bit line 110 may be substantially identically reversed by coupling "down" during the discharge of the bit line 110. Thus, after the coupling down interval 514, the voltage at the gate terminal 120 may be largely the same as it was before the charging and discharging of the bit line 110.

By contrast, conventional devices require a regulator to remove the coupling between the access line 110 and the gate terminal 120 as fast as possible to avoid variations in the voltage at the access line 110 that may affect the ability to perform a read or write operation and increase the variance of access line voltages between different memory cells. In conventional devices, the longer it takes to remove the coupling, the larger the variation between the access lines of different memory cells, and the less accurately the memory cells may be read or written to.

Figure 6:
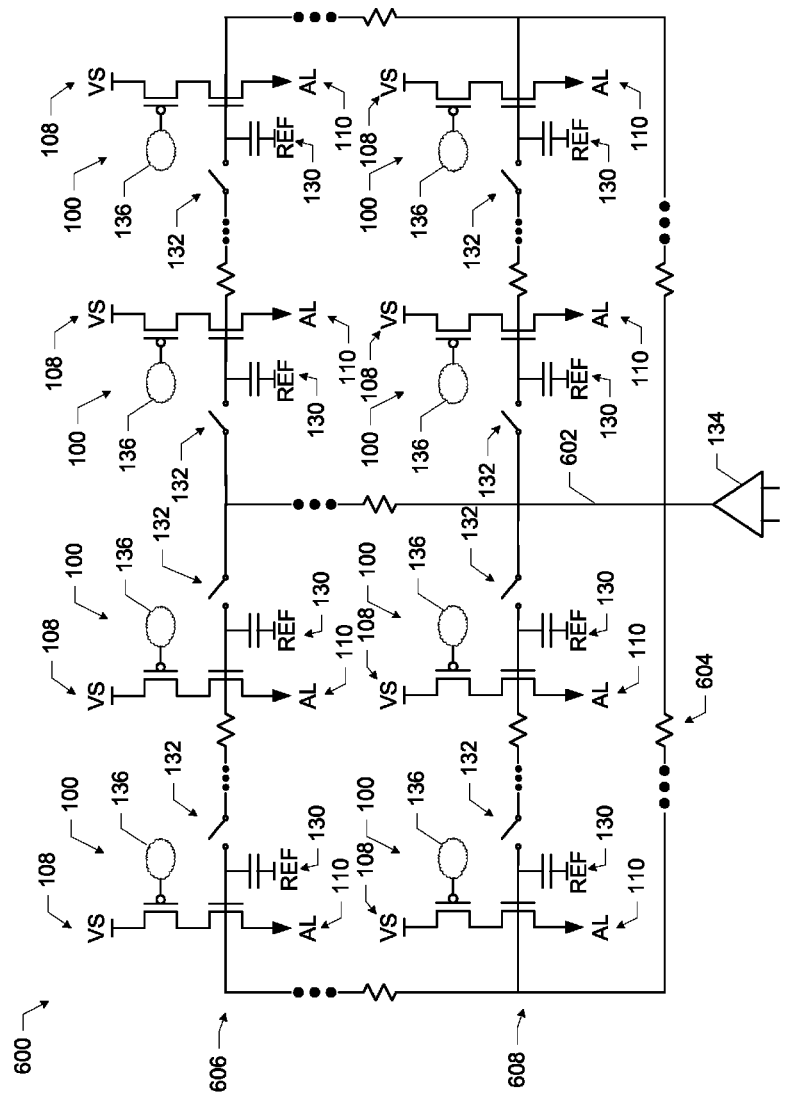
FIG. 6 is a schematic of an array of the bus circuit of FIG. 1, in accordance with various embodiments.

In some embodiments, multiple ones of the bus circuit disclosed herein may be arranged in an array. For example, FIG. 6 is a schematic of an array 600 of multiple ones of the bus circuit 100 of FIG. 1, in accordance with various embodiments. Each bus circuit 100 may be coupled to a different memory cell (not shown) via an access line 110 (a bit line or a word line). As shown, the switches 132 of the bus circuits 100 may each be coupled to the voltage regulator 134 via routing 602. The routing 602 may provide resistance to electrical signal flow, as indicated by the resistors distributed through the array 600 (such as the resistor 604).

In some embodiments, the array 600 may be a two-dimensional array distributed over a substrate of an integrated circuit, and may correspond to a two-dimensional array of memory cells distributed over the substrate. Groups of the bus circuit 100 within the array 600 (which may be referred to as "partitions" herein) may be simultaneously "activated" and made "idle" to read or write to the associated memory cells. For example, in some embodiments, the array 600 may include multiple rows (such as the rows 606 and 608), and all bus circuits 100 in a given row may have their switches 132 closed and opened in substantial synchronization. For example, each of the switches 132 of the bus circuits 100 in the row 606 may be open at substantially the same times as the other switches 132 of the bus circuits 100 in the row 606, and may be closed at substantially the same times as the other switches 132 of the bus circuits 100 in the row 606. If there are 128 memory cells in the row 606, all 128 memory cells may be written to or read from substantially simultaneously. The switch control logic 138 may be configured to enforce the synchronization of the opening and closing of the switches 132 in a particular group of bus circuits 100.

In some embodiments, two different groups of the bus circuit 100 within the array 600 may not be allowed to be simultaneously activated. For example, in some embodiments, only one row of memory cells may be read at a time. Thus, for example, if the switches 132 of the bus circuits 100 in the row 606 are opened to facilitate a read of the corresponding memory cells, the switches 132 of the bus circuits 100 in the row 608 may be closed. The switch control logic 138 may be configured to enforce any desired rules governing what groups of bus circuits 100 may have their switches 132 opened or closed at a particular time.

In some embodiments, a two dimensional array of memory cells (and a corresponding two-dimensional array of the bus circuits 100) may include various components physically positioned at the periphery of the array. In some embodiments, one side of the array may be designated for physical positioning of these components (and thus all voltage regulators, for example, may be required to be located in the periphery on this side of the array). For example, in some embodiments, the voltage regulator 134 may be located at a periphery of the two-dimensional array of memory cells. In some embodiments, the control logic 136 may be located at a periphery of the two-dimensional array of memory cells. In some embodiments, the switch control logic 138 may be located at a periphery of the two-dimensional array of memory cells. In some embodiments, the voltage regulator 134, the control logic 136, and the switch control logic 138 may be located at a periphery of the two-dimensional array of memory cells (e.g., all in a common side of the two-dimensional array of memory cells). In some embodiments, the switches 132 and the capacitors 124 of the bus circuits 100 may be distributed through the two-dimensional array and not located at the periphery. As noted above, various ones of the embodiments disclosed herein may enable the use of voltage regulators (e.g., the voltage regulator 134) with smaller footprints than conventional approaches. Using voltage regulators with smaller footprints may enable the amount of space on a chip devoted to peripheral components to be reduced, enabling more memory cells to be included in the chip.

Figure 7:
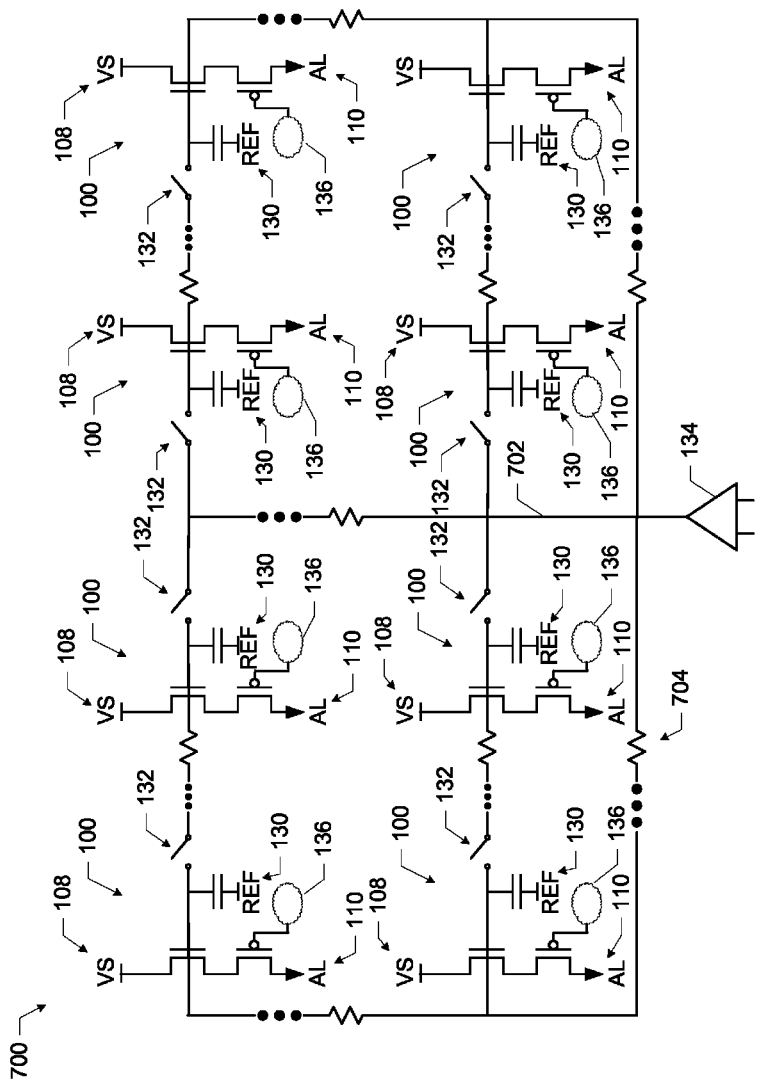
FIG. 7 is a schematic of an array of the bus circuit of FIG. 2, in accordance with various embodiments.

FIG. 7 is a schematic of an array 700 of multiple ones of the bus circuit 100 of FIG. 2, in accordance with various embodiments. Each bus circuit 100 may be coupled to a different memory cell (not shown) via an access line 110 (a bit line or a word line). As shown, the switches 132 of the bus circuits 100 may each be coupled to the voltage regulator 134 via routing 702. The routing 702 may provide resistance to electrical signal flow, as indicated by the resistors distributed through the array 700 (such as the resistor 704). As discussed above in detail with reference to the array 600 of FIG. 6, the switch control logic 138 governing the switches 132 of the bus circuits 100 of the array 700 may be configured to synchronize the opening and closing of certain different switches 132 (e.g., in groups) and/or to control the opening and closing of certain different switches 132 (e.g., in groups) so that one switch 132 is closed when another switch 132 is open. Also, the array 700 may be laid out in an integrated circuit as a two-dimensional array, and the voltage regulator 134, the control logic 136, and/or the switch control logic 138 may be positioned at the periphery of the two-dimensional array in accordance with any of the embodiments discussed above with reference to the array 600 of FIG. 6.

Figure 8:
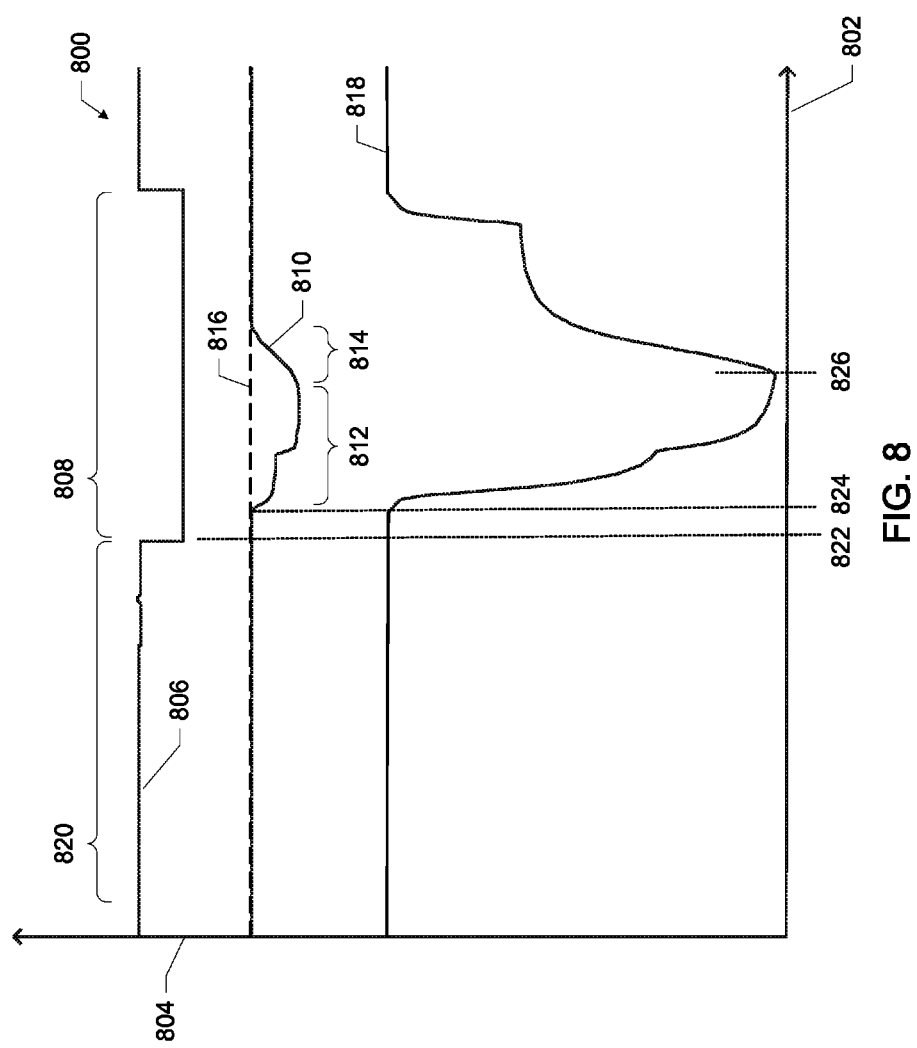
FIG. 8 is a plot illustrating operational characteristics of the bus circuits of FIGS. 3 and 4, in accordance with various embodiments.

FIG. 8 is a plot 800 illustrating operational characteristics of the bus circuits 100 of FIGS. 3 and 4, in accordance with various embodiments. In particular, the plot 800 represents various voltage signals in the bus circuit 100 (along the voltage axis 804) as a function of time (along the time axis 802) when the access line 110 is a bit line. The voltage signal 810 represents the voltage at the gate terminal 120 of the first transistor 104, and the voltage signal 816 represents the regulated voltage output from the voltage regulator 134. The voltage signal 806 represents the control voltage provided to the switch 132 by the switch control logic 138. When the voltage signal 806 is "high," the switch 132 is closed, and when the voltage signal 806 is "low," the switch 132 is open. As shown in FIG. 8, a switch closed interval 820 transitions to a switch open interval 808 at a time 822. During the switch closed interval 820, the voltage signal 810 may be substantially identical to the voltage signal 816. The voltage signal 818 represents the voltage at the bit line 110.

At a time 824, the control logic 136 may cause the second transistor 106 to close, allowing the supply voltage 108 to charge the bit line 110 negatively (as reflected in the voltage signal 818) to perform a read or write operation. The voltage at the gate terminal 120 may couple with the voltage at the bit line 110, causing the voltage at the gate terminal 120 (represented by the voltage signal 810) to change as the voltage at the bit line 110 (the voltage signal 818) changes. In particular, as the bit line 110 charges "down," the voltage at the gate terminal 120 (the voltage signal 810) may couple "down" during the interval 812.

The read or write operations may take place at approximately the time 826. It is at this time that the voltage at the gate terminal 120 (represented by the voltage signal 810) should reach the desired level to ensure that the voltage at the bit line 110 (represented by the voltage signal 818) is at its desired value. Once the read or write operation has taken place, the bit line 110 may be allowed to discharge. As the bit line 110 discharges, the voltage at the gate terminal 120 (the voltage signal 810) may couple "up" during the interval 814. Because the voltage at the bit line 110 starts at and returns to the same "discharged" voltage, any coupling "down" that occurs at the gate terminal 120 during the charging of the bit line 110 may be substantially identically reversed by coupling "up" during the discharge of the bit line 110. Thus, after the coupling down interval 814, the voltage at the gate terminal 120 may be largely the same as it was before the charging and discharging of the bit line 110.

Figure 9:
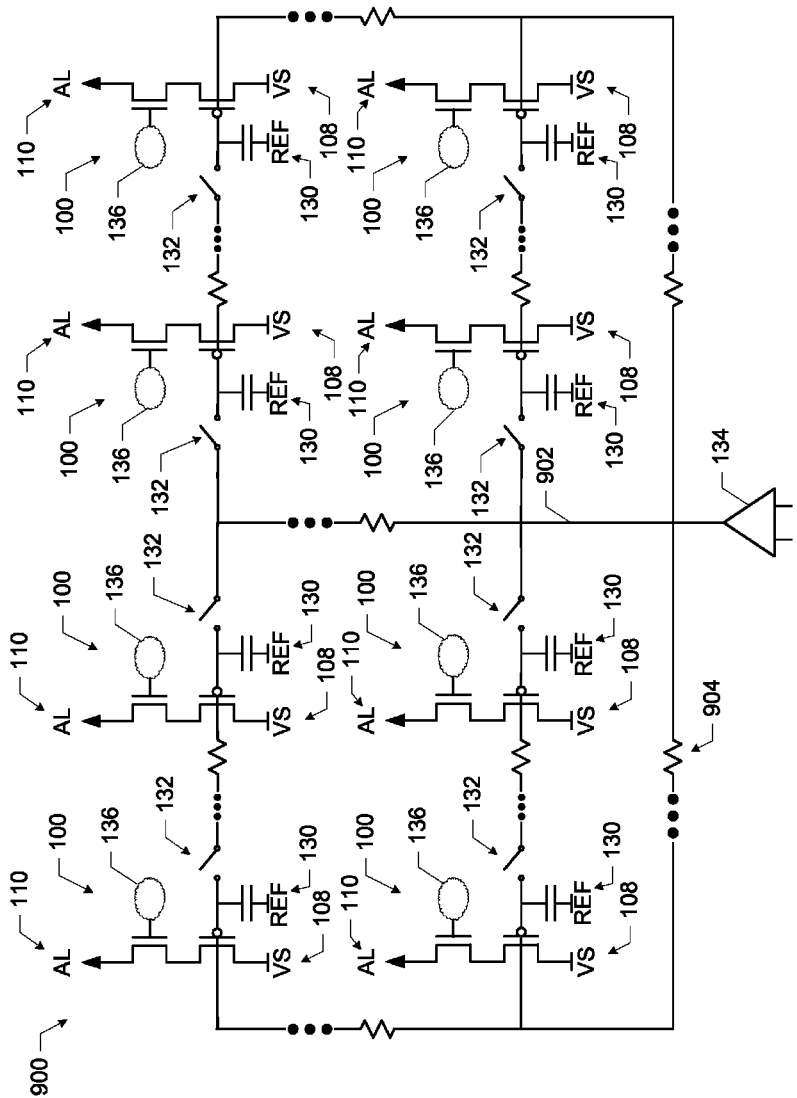
FIG. 9 is a schematic of an array of the bus circuit of FIG. 3, in accordance with various embodiments.

As noted above, in some embodiments, multiple ones of the bus circuits disclosed herein may be arranged in an array. FIG. 9 is a schematic of an array 900 of multiple ones of the bus circuit 100 of FIG. 3, in accordance with various embodiments. Each bus circuit 100 may be coupled to a different memory cell (not shown) via an access line 110 (a bit line or a word line). As shown, the switches 132 of the bus circuits 100 may each be coupled to the voltage regulator 134 via routing 902. The routing 902 may provide resistance to electrical signal flow, as indicated by the resistors distributed through the array 900 (such as the resistor 904). As discussed above in detail with reference to the array 600 of FIG. 6, the switch control logic 138 governing the switches 132 of the bus circuits 100 of the array 900 may be configured to synchronize the opening and closing of certain different switches 132 (e.g., in groups) and/or to control the opening and closing of certain different switches 132 (e.g., in groups) so that one switch 132 is closed when another switch 132 is open. Also, the array 900 may be laid out in an integrated circuit as a two-dimensional array, and the voltage regulator 134, the control logic 136, and/or the switch control logic 138 may be positioned at the periphery of the two-dimensional array in accordance with any of the embodiments discussed above with reference to the array 600 of FIG. 6.

Figure 10:
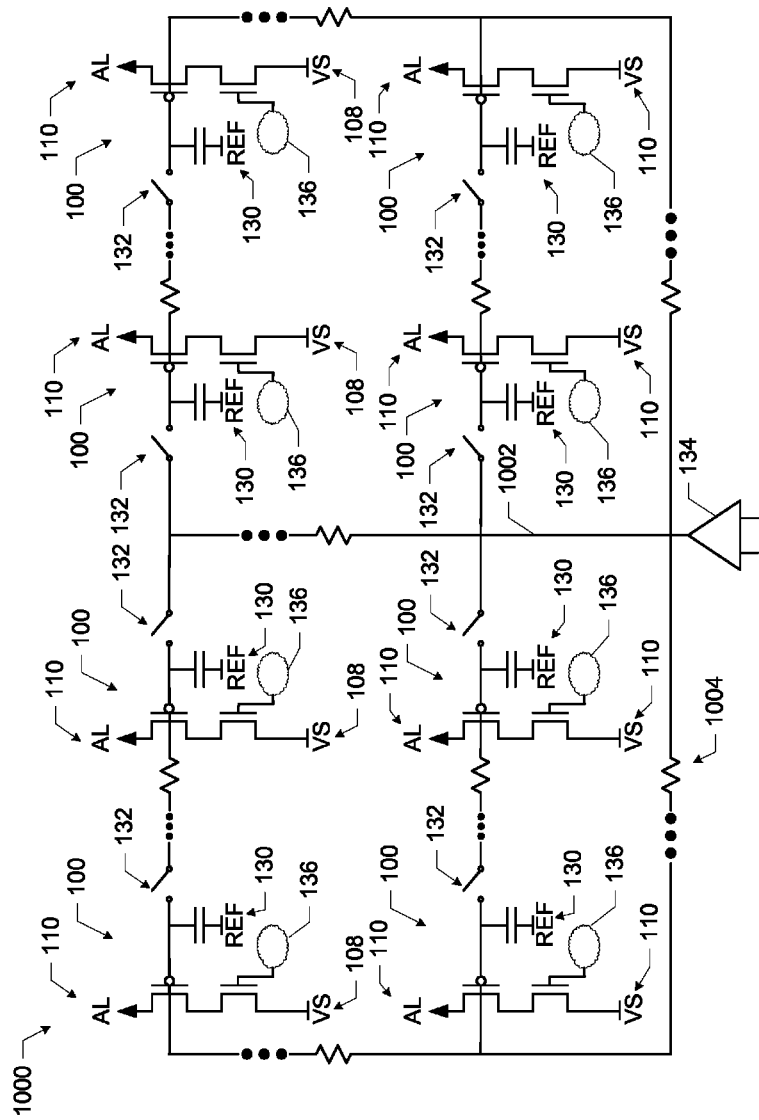
FIG. 10 is a schematic of an array of the bus circuit of FIG. 4, in accordance with various embodiments.

FIG. 10 is a schematic of an array 1000 of the bus circuit 100 of FIG. 4, in accordance with various embodiments. Each bus circuit 100 may be coupled to a different memory cell (not shown) via an access line 110 (a bit line or a word line). As shown, the switches 132 of the bus circuits 100 may each be coupled to the voltage regulator 134 via routing 1002. The routing 1002 may provide resistance to electrical signal flow, as indicated by the resistors distributed through the array 1000 (such as the resistor 1004). As discussed above in detail with reference to the array 600 of FIG. 6, the switch control logic 138 governing the switches 132 of the bus circuits 100 of the array 1000 may be configured to synchronize the opening and closing of certain different switches 132 (e.g., in groups) and/or to control the opening and closing of certain different switches 132 (e.g., in groups) so that one switch 132 is closed when another switch 132 is open. Also, the array 1000 may be laid out in an integrated circuit as a two-dimensional array, and the voltage regulator 134, the control logic 136, and/or the switch control logic 138 may be positioned at the periphery of the two-dimensional array in accordance with any of the embodiments discussed above with reference to the array 600 of FIG. 6.

The embodiments of bus circuits discussed above have largely focused on configurations in which a single voltage regulator (e.g., the voltage regulator 134) provides a single regulated voltage value for the entire bus. However, any these embodiments may be modified to enable the provision of multiple regulated voltages that may be selectively provided to a bus to change the voltage provided to one or more access lines (a bit line and/or a word line) of a memory cell. FIG. 11 is a schematic of a bus circuit 1100 including multiple regulated voltages, in accordance with various embodiments. In particular, the bus circuit 1100 includes multiple instantiations of the bus circuit 100 of FIG. 1, each coupled to a different voltage regulator providing a different regulated voltage. In FIG. 11, the bus circuit 1112 is coupled to the voltage regulator 1102, the bus circuit 1114 is coupled to the voltage regulator 1104, the bus circuit 1116 is coupled to the voltage regulator 1106, and the bus circuit 1118 is coupled to the voltage regulator 1108. Each of the voltage regulators 1102-1108 may supply a different regulated voltage. Multiplexing functionality may be performed by the selective enabling of a particular source follower arrangement 102 (e.g., via the control logic 136)

This architecture is in contrast to conventional approaches for enabling multiple regulated voltages, in which different supplies are multiplexed onto a gate terminal of a single source follower. Although using multiple instantiations of the bus circuit 100 in the bus circuit 1100 may incur area costs, this approach does not require the voltage regulators 1102-1108 to actively regulate the gate terminal of a single source follower that may be required to maintain any of a number of different voltages. Consequently, power and/or area savings may ultimately be realized. Although the bus circuit 1100 of FIG. 11 includes multiple instantiations of the bus circuit 100 of FIG. 1, the bus circuit 1100 may include instantiations of any of the bus circuits 100 disclosed herein (e.g., the bus circuits 100 of FIGS. 1-4). Additionally, although the bus circuit 1100 of FIG. 11 includes four different voltage regulators, any desired number of voltage regulators may be included in the bus circuit 1100.

Figure 12:
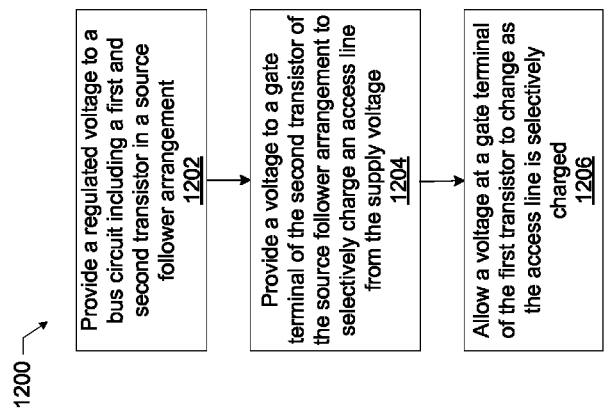
FIG. 12 is a flow diagram of a method of operating a memory device, in accordance with various embodiments.

FIG. 12 is a flow diagram of a method 1200 of operating a memory device, in accordance with various embodiments. Although the method 1200 may be advantageously used with any of the embodiments of the bus circuit 100 disclosed herein, any suitable bus circuit and memory device arrangement may be used in the performance of the method 1200.

At 1202, a regulated voltage may be provided to a bus circuit. The bus circuit may include a source follower arrangement having a first transistor and a second transistor, and the source follower arrangement may be coupled between a supply voltage and an access line (a bit line or a word line) of a memory cell. The first transistor and the second transistor of the source follower arrangement may each have a gate terminal, and the regulated voltage may be provided to the gate terminal of the first transistor.

At 1204, a voltage may be provided to the gate terminal of the second transistor to selectively charge the access line from the supply voltage.

At 1206, a voltage at the gate terminal of the first transistor may be allowed to rise as the access line is selectively charged. In some embodiments, allowing the voltage at the gate terminal of the first transistor to rise at 1206 may include allowing the voltage at the gate terminal of the first transistor to change without active regulation. In some embodiments, allowing the voltage at the gate terminal of the first transistor to change may include allowing a voltage at the access line to couple with the gate terminal of the first transistor.

In some embodiments, after allowing the voltage at the gate terminal of the first transistor to change as the access line is selectively charged at 1206, the method 1200 may also include allowing the voltage at the gate terminal of the first transistor to return to the regulated voltage (not shown in FIG. 12). For example, allowing the voltage at the gate terminal of the first transistor to return to the regulated voltage may include allowing the voltage at the gate terminal of the first transistor to return to the regulated voltage during discharge of the access line.

Figure 13:
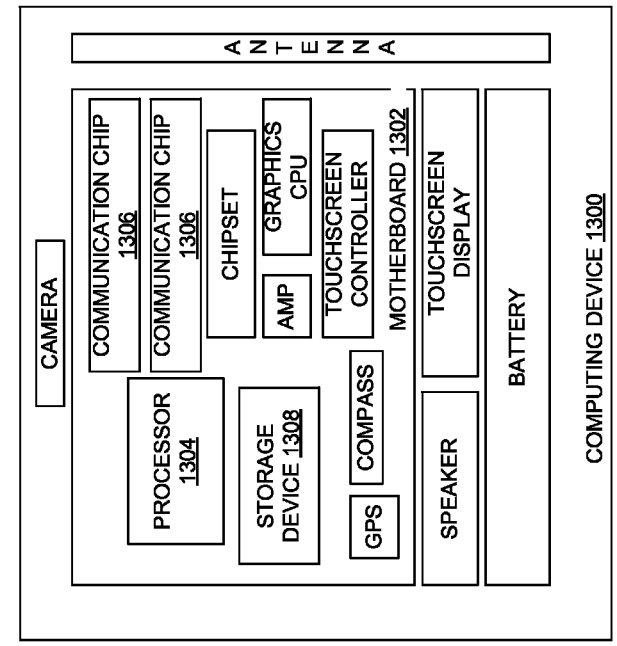
FIG. 13 is a block diagram of an example computing device that may include one or more of any of the bus circuits disclosed herein.

Embodiments of the present disclosure may be implemented into a system using any memory devices that may benefit from the bus circuits and related techniques disclosed herein. FIG. 13 schematically illustrates a computing device 1300, in accordance with some implementations, which may include memory devices having bus circuits formed and operating in accordance with one or more of the embodiments disclosed herein (e.g., any of the bus circuits 100, arrays including any of the bus circuits 100, or other arrangements including any of the bus circuits 100).

The computing device 1300 may be, for example, a mobile communication device or a desktop or rack-based computing device. The computing device 1300 may house a board such as a motherboard 1302. The motherboard 1302 may include a number of components, including (but not limited to) a processor 1304 and at least one communication chip 1306. Any of the components discussed herein with reference to the computing device 1300 may include a memory device having a bus circuit formed or operating in accordance with any of the embodiments disclosed herein. The processor 1304 may be physically and electrically coupled to the motherboard 1302. The term "processor" may refer to any device or portion of a device that processes electronic data from registers and/or memory to transform that electronic data into other electronic data that may be stored in registers and/or memory. In some implementations, the at least one communication chip 1306 may also be physically and electrically coupled to the motherboard 1302. In further implementations, the communication chip 1306 may be part of the processor 1304.

The computing device 1300 may include a storage device 1308. The storage device 1308 may include any one or more memory devices having a bus circuit formed or operating in accordance with any of the embodiments disclosed herein. In some embodiments, the storage device 1308 may include one or more solid state drives. Examples of storage devices that may be included in the storage device 1308 include volatile memory (e.g., dynamic random access memory (DRAM)), non-volatile memory (e.g., read-only memory, ROM), flash memory, and mass storage devices (such as hard disk drives, compact discs (CDs), digital versatile discs (DVDs), and so forth).

Depending on its applications, the computing device 1300 may include other components that may or may not be physically and electrically coupled to the motherboard 1302. These other components may include, but are not limited to, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera. Any of these other components may include any one or more memory devices having a bus circuit formed or operating in accordance with any of the embodiments disclosed herein.

The communication chip 1306 and the antenna may enable wireless communications for the transfer of data to and from the computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1306 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wide area (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1306 may operate in accordance with a Global System for Mobile Communications (GSM), General Packet Radio Service (GPRS), Universal Mobile Telecommunications System (UMTS), High Speed Packet Access (HSPA), Evolved HSPA (E-HSPA), or LTE network. The communication chip 1306 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1306 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1306 may operate in accordance with other wireless protocols in other embodiments.

The computing device 1300 may include a plurality of communication chips 1306. For instance, a first communication chip 1306 may be dedicated to shorter range wireless communications such as Wi-Fi and Bluetooth, and a second communication chip 1306 may be dedicated to longer range wireless communications such as GPS, EDGE, GPRS, CDMA, WiMAX, LTE, EV-DO, and others. In some embodiments, the communication chip 1306 may support wired communications. For example, the computing device 1300 may include one or more wired servers.

In various implementations, the computing device 1300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1300 may be any other electronic device that processes data. In some embodiments, the bus circuits disclosed herein may be implemented in a high-performance computing device.

The following paragraphs provide examples of the embodiments disclosed herein.

Example 1 is a bus circuit, including: a source follower arrangement, including a first transistor and a second transistor, coupled between a supply voltage and an access line of a memory cell, wherein the first transistor and the second transistor each have a gate terminal and wherein the access line is a bit line or a word line; a capacitor having a first terminal coupled to the gate terminal of the first transistor and having a second terminal coupled to a reference voltage; and a switch coupled between the first terminal of the capacitor and a voltage regulator.

Example 2 may include the subject matter of Example 1, and may further specify that the first transistor is an NMOS transistor.

Example 3 may include the subject matter of Example 2, and may further specify that the second transistor is coupled between the first transistor and the supply voltage.

Example 4 may include the subject matter of Example 2, and may further specify that the second transistor is coupled between the first transistor and the access line.

Example 5 may include the subject matter of Example 1, and may further specify that the first transistor is a PMOS transistor.

Example 6 may include the subject matter of Example 5, and may further specify that the second transistor is coupled between the first transistor and the supply voltage.

Example 7 may include the subject matter of Example 5, and may further specify that the second transistor is coupled between the first transistor and the access line.

Example 8 may include the subject matter of any of Examples 1-7, and may further include control logic for the source follower arrangement, coupled to the gate terminal of the second transistor, to cause selective charging of the access line from the supply voltage.

Example 9 may include the subject matter of any of Examples 1-8, and may further include switch control logic coupled to the switch to cause selective opening and closing of the switch.

Example 10 may include the subject matter of Example 9, and may further specify that the switch control logic is to close the switch when no read or write operation is being performed on the memory cell and to open the switch during a read or write operation on the memory cell.

Example 11 may include the subject matter of any of Examples 1-10, and may further specify that the source follower arrangement is a first source follower arrangement, the capacitor is a first capacitor, the switch is a first switch, and the voltage regulator is a first voltage regulator, and may further include: a second source follower arrangement, including a first transistor and a second transistor, coupled between the supply voltage and the access line of the memory cell, wherein the first transistor and the second transistor of the second source follower arrangement each have a gate terminal; a second capacitor having a first terminal coupled to the gate terminal of the first transistor of the second source follower arrangement and having a second terminal coupled to the reference voltage; and a second switch coupled between the first terminal of the second capacitor and a second voltage regulator; wherein the first and second voltage regulators are to provide different regulated voltages.

Example 12 is a memory device, including: a memory cell having an access line, wherein the access line is a bit line or a word line; and a bus circuit, coupled to the memory cell. The bus circuit includes: a source follower arrangement, including a first transistor and a second transistor, coupled between a supply voltage and the access line of the memory cell, wherein the first transistor and the second transistor each have a gate terminal, a capacitor having a first terminal coupled to the gate terminal of the first transistor and having a second terminal coupled to a reference voltage, and a switch coupled between the first terminal of the capacitor and a voltage regulator.

Example 13 may include the subject matter of Example 12, and may further include switch control logic coupled to the switch to close the switch when no read or write operation is being performed on the memory cell and to open the switch during a read or write operation on the memory cell.

Example 14 may include the subject matter of any of Examples 12-13, and may further specify that the memory cell is a first memory cell, and may further include a second memory cell having an access line, wherein the access line is a bit line or a word line; wherein the source follower arrangement is a first source follower arrangement, the capacitor is a first capacitor, the switch is a first switch, and the voltage regulator is a first voltage regulator, and wherein the bus circuit further includes: a second source follower arrangement, including a first transistor and a second transistor, coupled between the supply voltage and the access line of the second memory cell, wherein the first transistor and the second transistor of the second source follower arrangement each have a gate terminal; a second capacitor having a first terminal coupled to the gate terminal of the first transistor of the second source follower arrangement and having a second terminal coupled to the reference voltage; and a second switch coupled between the first terminal of the second capacitor and the voltage regulator.

Example 15 may include the subject matter of Example 14, and may further include switch control logic to synchronize the opening and closing of the first switch and the second switch.

Example 16 may include the subject matter of any of Examples 14-15, and may further include switch control logic to control the opening and closing of the first switch and the second switch so that the first switch is not open when the second switch is open.

Example 17 may include the subject matter of any of Examples 14-16, wherein the first and second memory cells are included in a two-dimensional array of memory cells, and wherein the voltage regulator is located at a periphery of the two-dimensional array of memory cells.

Example 18 may include the subject matter of any of Examples 14-17, and may further specify that the access line is a bit line.

Example 19 may include the subject matter of any of Examples 14-18, and may further specify that the reference voltage is a ground.

Example 20 is a method of operating a memory device, including: providing a regulated voltage to a bus circuit, wherein the bus circuit includes a source follower arrangement, the source follower arrangement includes a first transistor and a second transistor, the source follower arrangement is coupled between a supply voltage and an access line of a memory cell, the access line of the memory cell is a bit line or a word line, and the first transistor and the second transistor each have a gate terminal, and the regulated voltage is provided to the gate terminal of the first transistor. The method further includes providing a voltage to the gate terminal of the second transistor to selectively charge the access line from the supply voltage and allowing a voltage at the gate terminal of the first transistor to change as the access line is selectively charged.

Example 21 may include the subject matter of Example 20, and may further specify that allowing the voltage at the gate terminal of the first transistor to change includes allowing the voltage at the gate terminal of the first transistor to change without active regulation.

Example 22 may include the subject matter of any of Examples 20-21, and may further specify that allowing the voltage at the gate terminal of the first transistor to change includes allowing a voltage at the access line to couple with the gate terminal of the first transistor.

Example 23 may include the subject matter of any of Examples 20-22, and may further include, after allowing the voltage at the gate terminal of the first transistor to change as the access line is selectively charged, allowing the voltage at the gate terminal of the first transistor to return to the regulated voltage.

Example 24 may include the subject matter of Example 23, and may further specify that allowing the voltage at the gate terminal of the first transistor to return to the regulated voltage includes allowing the voltage at the gate terminal of the first transistor to return to the regulated voltage during discharge of the access line.

What is claimed is:

1. A bus circuit, comprising:
a source follower arrangement, comprising a first transistor and a second transistor, coupled between a supply voltage and an access line of a memory cell, wherein the first transistor and the second transistor each have a gate terminal and wherein the access line is a bit line or a word line;
a capacitor having a first terminal coupled to the gate terminal of the first transistor and having a second terminal coupled to a reference voltage; and
a switch coupled between the first terminal of the capacitor and a voltage regulator, wherein the switch is to be closed when no read or write operation is to be performed on the memory cell, and to be open when a read or write operation is to be performed on the memory cell.

2. The bus circuit of claim 1, wherein the first transistor is an NMOS transistor.

3. The bus circuit of claim 2, wherein the second transistor is coupled between the first transistor and the supply voltage.

4. The bus circuit of claim 2, wherein the second transistor is coupled between the first transistor and the access line.

5. The bus circuit of claim 1, wherein the first transistor is a PMOS transistor.

6. The bus circuit of claim 5, wherein the second transistor is coupled between the first transistor and the supply voltage.

7. The bus circuit of claim 5, wherein the second transistor is coupled between the first transistor and the access line.

8. The bus circuit of claim 1, further comprising:
control logic for the source follower arrangement, coupled to the gate terminal of the second transistor, to cause selective charging of the access line from the supply voltage.

9. The bus circuit of claim 1, further comprising:
switch control logic coupled to the switch to cause selective opening and closing of the switch.

10. The bus circuit of claim 1, wherein the source follower arrangement is a first source follower arrangement, the capacitor is a first capacitor, the switch is a first switch, and the voltage regulator is a first voltage regulator, and further comprising:
a second source follower arrangement, comprising a first transistor and a second transistor, coupled between the supply voltage and the access line of the memory cell, wherein the first transistor and the second transistor of the second source follower arrangement each have a gate terminal;
a second capacitor having a first terminal coupled to the gate terminal of the first transistor of the second source follower arrangement and having a second terminal coupled to the reference voltage; and
a second switch coupled between the first terminal of the second capacitor and a second voltage regulator;
wherein the first and second voltage regulators are to provide different regulated voltages.

11. A memory device, comprising:
a memory cell having an access line, wherein the access line is a bit line or a word line; and
a bus circuit, coupled to the memory cell, comprising:
a source follower arrangement, comprising a first transistor and a second transistor, coupled between a supply voltage and the access line of the memory cell, wherein the first transistor and the second transistor each have a gate terminal,
a capacitor having a first terminal coupled to the gate terminal of the first transistor and having a second terminal coupled to a reference voltage,
a switch coupled between the first terminal of the capacitor and a voltage regulator; and
switch control logic coupled to the switch to close the switch when no read or write operation is being performed on the memory cell and to open the switch during a read or write operation on the memory cell.

12. The memory device of claim 11, wherein the memory cell is a first memory cell, and further comprising:
a second memory cell having an access line, wherein the access line is a bit line or a word line;
wherein the source follower arrangement is a first source follower arrangement, the capacitor is a first capacitor, the switch is a first switch, and the voltage regulator is a first voltage regulator, and wherein the bus circuit further comprises:
a second source follower arrangement, comprising a first transistor and a second transistor, coupled between the supply voltage and the access line of the second memory cell, wherein the first transistor and the second transistor of the second source follower arrangement each have a gate terminal;
a second capacitor having a first terminal coupled to the gate terminal of the first transistor of the second source follower arrangement and having a second terminal coupled to the reference voltage; and
a second switch coupled between the first terminal of the second capacitor and the voltage regulator.

13. The memory device of claim 12, further comprising:
switch control logic to synchronize the opening and closing of the first switch and the second switch.

14. The memory device of claim 12, further comprising:
switch control logic to control the opening and closing of the first switch and the second switch so that the first switch is not open when the second switch is open.

15. The memory device of claim 12, wherein the first and second memory cells are included in a two-dimensional array of memory cells, and wherein the voltage regulator is located at a periphery of the two-dimensional array of memory cells.

16. The memory device of claim 12, wherein the access line is a bit line.

17. The memory device of claim 12, wherein the reference voltage is a ground.

18. A method of operating a memory device, comprising:
providing a regulated voltage to a bus circuit, wherein:
the bus circuit comprises a source follower arrangement,
the source follower arrangement comprises a first transistor and a second transistor,
the source follower arrangement is coupled between a supply voltage and an access line of a memory cell,
the access line of the memory cell is a bit line or a word line, and
the first transistor and the second transistor each have a gate terminal, and the regulated voltage is provided to the gate terminal of the first transistor;

providing a voltage to the gate terminal of the second transistor to selectively charge the access line from the supply voltage; and allowing a voltage at the gate terminal of the first transistor to change as the access line is selectively charged, including allowing a voltage at the access line to couple with the gate terminal of the first transistor.

19. The method of claim 18, wherein allowing the voltage at the gate terminal of the first transistor to change comprises allowing the voltage at the gate terminal of the first transistor to change without active regulation.

20. The method of claim 18, further comprising:

after allowing the voltage at the gate terminal of the first transistor to change as the access line is selectively charged, allowing the voltage at the gate terminal of the first transistor to return to the regulated voltage.

21. The method of claim 20, wherein allowing the voltage at the gate terminal of the first transistor to return to the regulated voltage comprises allowing the voltage at the gate terminal of the first transistor to return to the regulated voltage during discharge of the access line.

* * * * *